United States Patent [19]

Dahlman

[11] 3,751,257

[45] Aug. 7, 1973

[54] POLYAMIDE-DIAZO RESIN COMPOSITION

[75] Inventor: Keith E. Dahlman, White Bear Lake, Minn.

[73] Assignee: Minnesota Mining and Manufacturing Company, St. Paul, Minn.

[22] Filed: Apr. 16, 1971

[21] Appl. No.: 134,615

[52] U.S. Cl. .......................... 96/91 R, 96/33, 96/75, 96/86

[51] Int. Cl. ........................... G03c 1/52, G03f 7/02

[58] Field of Search ............................... 96/75, 91 R

[56] References Cited

UNITED STATES PATENTS 3,660,097 5/1972 Mainthia ............................ 96/75 X

*Primary Examiner*—David Klein

*Attorney*—Alexander, Sell, Steldt & Delahunt

[57] ABSTRACT

An oleophobic composition suitable as the ink-receptive areas for printing plates comprising as a dried coating at least 50 percent by weight of light-sensitive diazo resin and no more than 50 percent by weight of a polyamide resin. The printing plate so provided is developed by an aqueous solution of a wetting agent which removes unexposed portions of the diazo-polyamide resin coating without any substantial effect on the exposed portions.

14 Claims, 3 Drawing Figures

INVENTOR.
KEITH E. DAHLMAN
BY Kinney, Alexander
Sell, Steldt & De La Hunt
ATTORNEYS

POLYAMIDE-DIAZO RESIN COMPOSITION

This invention relates to a composition of matter suitable as the ink-receptive layer of a presensitized printing plate, and to the printing plate and other applications so provided.

Metal backed presensitized printing plates, the subject of Jewett and Case U.S. Pat. No. 2,714,066, comprise a metal backing, and a coating of a light-sensitive diazo resin thereover. The printer purchases the plate in this form, exposes and develops the plate and thereafter applies an image developer which both strengthens the image and makes it visible.

This post-development application of image developer by the printer, who has neither the coating equipment nor skill, proved disadvantageous from the standpoint of time and copy quality due to variations in image developer composition and coating thickness.

This disadvantage was overcome with the advent of the printing plate described in Larson, U.S. Pat. No. 3,136,637. As manufactured, this plate has a coating overlying a light-sensitive diazo resin of an actinic radiation transmittable organophilic resin layer which avoids the necessity for an image developer applied by the printer. Exposure of this latter described plate insolubilizes the light struck diazo resin. Development of the plate is predicated upon removal of non-light struck diazo resin and its overlying organophilic resin layer. To selectively remove unexposed diazo resin first requires a developer which will as rapidly as possible (1) penetrate without dissolving the organophilic resin layer in order to reach the diazo layer and (2) dissolve the unexposed underlying diazo resin. Once the unexposed diazo resin is dissolved, the organophilic resin overlying the dissolved diazo resin can be removed by a slight swabbing or rubbing action.

Developers which will accomplish this dual function unavoidably soften the entire organophilic resin layer, however. Upon removal of unexposed diazo resin by physical rubbing the surface of the plate, not only the overlying organophilic resin layer but on occasion some of the organophilic resin overlying exposed diazo resin is removed, due to the over-all softened condition of the organophilic resin. This loss of organophilic resin in image areas means, of course, a loss in press-life and image definition in the copies produced by such a plate.

A primary object of this invention is a press-ready printing plate, i.e., one not requiring post-development treatment with a lacquer or the like, which can be developed without softening or weakening the oleophilic image surface.

Another object is the provision of such a plate which is resistant to the degradative effects of heat and humidity.

Still another object is the provision of such a plate having a hard, tough, abrasion resistant organophilic image surface.

These and other objects and advantages to be made apparent hereinafter are provided in one embodiment of this invention by an organophilic composition suitable as the ink-receptive surface for a printing plate and for other uses comprising a mixture of a mutually soluble polyamide resin and a light-sensitive diazo resin present in proportions sufficient to provide a dried coating comprising at least 50 percent by weight of said diazo resin and no more than about 50 percent by weight of said polyamide resin. Generally, the dried coating comprises a major proportion of diazo resin and a minor proportion of polyamide resin, preferably from more than about 50 percent to about 90 percent diazo resin and from 10 percent to less than about 50 percent of polyamide resin. Most preferably, the proportions of mixture are such that the dried coating comprises about 60 percent to about 70 percent by weight diazo resin and about 30% to about 40 percent by weight polyamide resin.

In another embodiment, there is provided a printing plate comprising a dimensionally stable substrate having a hydrophilic, passivated surface and a coating on said surface of an organophilic, hydrophobic composition comprising a homogeneous mixture comprising a mutually soluble diazo resin and a polyamide resin, said diazo resin and said polyamide being present in the amounts noted above.

Organophilic compositions of the foregoing description have been found to be tough, abrasion resistant, and of improved resistance to the degradative effects of heat and humidity. Moreover, such compositions when present as a coating on a printing plate surface have been found to be developable by media which will substantially exclusively attack only the unexposed portions thereof without any softening or weakening of exposed portions.

Mixtures of light-sensitive diazo resin and polyamide resin have been previously disclosed as organophilic coatings for printing plates in commonly assigned U.S. Pat. Nos. 2,826,501 (Hodgins) and 3,201,247 (Leonard). However, both patents indicate that the constituents of the coating compound must be present in certain critical proportions, the ratio of diazo resin to polyamide being about 1 to 9, respectively, by weight. This is to be contrasted with the composition of the present invention which calls for a major amount of diazo resin relative to the polyamide resin. Moreover, whereas the above patents describe a post-development application of a lacquer emulsion, the composition of the present invention provides a press-ready printing plate entirely free of the need for post-development treatments.

Suitable substrates for the composition of this invention include paper, polymeric films, such as polyesters, e.g., polyvinyl acetate, textiles such as silk, metals such as zinc, copper, aluminum, and glass. Prior to application of the coating composition to the surface of such a substrate for lithographic purposes, it is generally necessary to passivate the surface to prevent any deleterious interaction between the surface and the diazo resin. Such passivating treatments may also promote a firm bond between the light exposed portions of the coating and the substrate and may also aid in providing a hydrophilic surface during the printing process. The silicate treatment described in Jewett and Case, U.S. Pat. No. 2,714,066 is the preferred passivating treatment for metal substrates. Other passivating treatments are disclosed in U.S. Pat. No. 2,946,638 (zirconium hexahalide), U.S. Pat. No. 3,201,247 (phosphomolybdate treatment), and U.S. Pat. No. 3,148,984. Suitable coating to accomplish the same purpose are described in U.S. Pat. No. 3,161,517 and U.S. Pat. No. 3,196,785.

Polyamide resins suitable in the practice of this invention are oleophilic, hydrophobic materials which are tough, flexible, and abrasion resistant. The polyamide resin should be mutually soluble with the diazo resin. By mutual solubility is meant the fact that the polyamide resin and light-sensitive diazo resin are both soluble in a common medium or system which may be one, or a mixture of, ingredients enabling the two components to be applied to a substrate to yield a homogeneous coating upon drying. Alcohol soluble polyamides are preferred. Suitable solvents include lower aliphatic alcohols ($C_1$—$C_6$), mixtures thereof with water or chlorinated hydrocarbons, benzyl alcohol, furfuryl alcohol, formic acid and phenol. Copolymers of caprolactam, the hexamethylene diamine salt of adipic acid, and the hexamethylene diamine salt of sebacic acid are preferred. Such copolymers commercially available under the tradename Elvamide 8061, 8062 and 8063, are alcohol soluble, clear, colorless, transparent, tough, flexible, resistant to abrasion, mold, weather and have the further following physical properties:

| | ASTM Method | ELVAMIDES: 8061 | 8062 | 8063 |
|---|---|---|---|---|
| MP. Fisher Johns | D 789 | 149–160°C | 141–149°C | 157°C |
| M.W. | | 20,000 | 20,000 | 20,000 |
| Sp. Gr. 73°F. | D 742 | 1.08 | 1.08 | 1.08 |
| Water absorption % 24 hr. | D 570 | 2.0 | 2.3 | 3.0 |
| Rockwell hardness | D 785 | R 83 | R 45 | R 14 |
| Tensile strength 73°F. | D 638 | 7,400 psi | 5,000 psi | 3,100 psi |
| Elongation 73°F. | D 638 | 300% | 300% | greater than 650% |

Elvamide 8061 exhibits superior toughness and abrasion resistance, 8062 has superior flexibility, but 8063 is preferred in the practice of this invention because of its superior solution stability.

The diazo resins to be admixed with the polyamide resin are light sensitive, water insoluble materials. The diazo resins should be soluble in a common solvent, i.e., mutually soluble, with the polyamide resin to assure a homogeneous, intimate mixture in the final coating. The preparation of suitable diazo resins is described in U.S. Pat. No. 2,714,066. Exemplary suitable salts of the condensation product of paraformaldehyde and p-diazodiphenylamine include the salts of phenol, fluorocaprylic acid, and the following sulfonic acids: triisopropyl naphthalene sulfonic acid, 4,4-biphenyldisulfonic acid, 5-nitro ortho-toluene sulfonic acid, 5-sulfosalicylic acid, 2,5-dimethyl benzene sulfonic acid, 2-nitrobenzene sulfonic acid, 1,3,6-naphthalenetrisulfonic acid, 3-chlorobenzene sulfonic acid, 3-bromobenzene sulfonic acid, 1-butane sulfonic acid, 2-chloro-5-nitrobenzene sulfonic acid, 2,4-dinitrobenzene sulfonic acid, 2-fluorocaprylic naphthalene sulfonic acid, fluorocaprylic sulfonic acid, 4-nitrobenzene sulfonic acid, 2,5-dichlorobenzene sulfonic acid, 2,4-dimethylbenzene sulfonic acid, 1-naphthol-5-sulfonic acid, and paratoluene sulfonic acid. A preferred diazo salt is that derived from the condensation product of paraformaldehyde and p-diazodiphenylamine and trisopropyl naphthalene sulfonic acid.

In addition to the diazo resin and polyamide resin, the coating composition may include one or more additives which can be coated from the same solvent as that employed for the diazo and polyamide resins. Alcohol soluble dyes which will provide a visible contrast between light-struck and non-light struck areas of the exposed plate and between the light-struck image areas and the passivated surface of the lithographic base of the developed plate are a preferred additive. Suitable dyes which can be included as part of the coating solution with the diazo and polyamide resins include Orasol Navy Blue 2RB, Methyl Violet, Congo Red and BASF Neozapon Blue HFL. Such dyes may be present in an amount sufficient to give a visible color upon exposure of the lithographic plate, generally up to about 7 parts per hundred by weight based upon the dried weight of the organophilic layer. Some improvement in abrasion resistance is obtained by the addition to the coating composition of organophilic materials suc as epoxy resins, polyvinyl chloride acetate, vinylidene chloride, polyvinyl acetate, ethyl cellusolve, and cellulose acetate butyrate, the latter being preferred, The preferred cellulose acetate butyrate is available under the tradename EAB272–20 from Eastman Chemical Products. Amounts of abrasion resistant additives up to about 7–8, preferably up to 5, parts per hundred by weight based on the dried weight of the organophilic layer have proved suitable.

The organophilic layer occurs as a single layer overlying the lithographic substrate which is hydrophilic and passivated to prevent deleterious interraction with the organophilic layer, especially the diazo resin therein. The organophilic layer is applied as a solution to the substrate and solvent removed by drying either under ambient conditions or elevated temperatures or reduced pressures or combinations thereof chosen so as not to be deleterious to the diazo resin. A preferred solvent system is a 1:1 by weight mixture of 2-methoxyethanol and n-propanol. Others include 2-methoxyethanol-methanol, dichloromethane-methanol, benzyl alcohol, and methanol-water.

Generally speaking, the press life of the lithographic plate is proportional to the dry coating weight. Coating weights of 20–30 mg./ft² are adequate to assure a press life of 5–10,000 copies. As light a coating as 10 mg./ft² will provide a plate capable of 5,000 copies when reasonable care is exercised in maintaining a clean and well-adjusted press. Heavier coating weights up to several hundred mg./ft² can be used with considerable exposure increase when much longer press life is required.

Development of the plate of this invention is accomplished by contacting the exposed plate with a developing medium comprising an aqueous solution of a wetting agent. A preferred developing medium is an aqueous solution of Duponol ME (tradename for the sodium salt of technical lauryl alcohol sulfate). As the concentration of wetting agent increases, development time is reduced. Above a certain concentration, generally about 8 percent by weight in the case of Duponol ME, there are diminishing returns in terms of development speed. Moreover, foaming and gel formation increase with increasing wetting agent concentration. A suitable range for the wetting agent concentration is from 0.005 percent to 30 percent, preferably 0.5 percent to 30 percent, and most preferably 4 percent to 8 percent, by weight based on the total weight of the developer. Complete removal of unexposed oleophilic coating (mixture of polyamide and diazo resins) occurs within 15–20 seconds without any substantial adverse effect on the exposed portions of the coating. This is to be contrasted with other printing plates having a polyamide surface and the developer employed in conjunction therewith. The developer for the polyamide-diazo coating described in the above-mentioned U.S. Pat. Nos. 2,826,501 and 3,201,247, which consists of N,N-dimethyl formamide and furfuryl alcohol and a minor amount of citric acid, dissolves nearly 50 percent of the exposed coating in the 5 seconds required to remove the unexposed areas to develop the image. By contrast, the combination of the plate and the preferred aqueous wetting agent solution developer of this invention permit complete removal of unexposed regions with substantially little or no removal of exposed regions.

Other wetting agents (detergents and emulsifiers) which may be used in the form of aqueous solutions to develop the plate of this invention include Alconox (tradename for an alkyl lauryl sodium sulfate), sodium octyl sulfate, ammonium salt of lauryl sulfate, sodium xylene sulfonate, Duponol LS (tradename for a mixture of sodium long chain sulfates), Salvo Laundry Soap, Soy Dome Hand Cleaner, and the mono-sodium salt of N,N-dihydroxyethylglycine. The foregoing list of developers are generally slower than the preferred sodium salt of lauryl alcohol sulfate and in most cases will remove some of the exposed portions (e.g., up to about 10 percent by weight) of the polyamide-diazo oleophilic coating as well as unexposed portions although far less than is removed by the developer disclosed in U.S. Pat. No. 2,826,501.

The ability to develop with aqueous solutions of wetting agents is surprising in that the polyamide-diazo resin mixture is water-insoluble prior to the exposure step yet afterwards the unexposed regions may be completely removed by aqueous developers as herein described.

As a result of the development capabilities of the printing plate of this invention, sharp, clear, and regular boundaries are achieved between image and non-image areas. Development being a phenomenon of solubility on a molecular scale as opposed to softening of the image layer, dissolving the underlying exposed diazo resin, and a physical removal of overlying image layer, extremely high resolutions are obtainable. Over 5230 lines per inch have been attained, a degree of resolution exceeding by more than three times that considered generally printable on average quality paper. In addition, due to the presence of a high percentage of the strongly oleophilic diazo resin, more smooth, even ink lay-down is possible which not only provides excellent copy quality but permits greater flexibility in ink formulations.

To better illustrate the invention reference is made to the attached drawings wherein.

Figure 1:
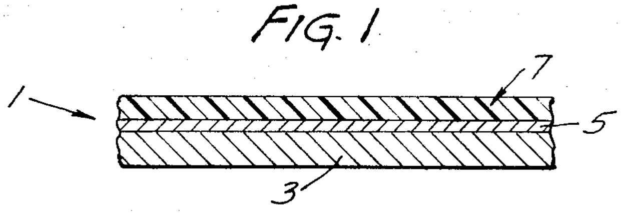
FIG. 1 is a cross-sectional view in elevation of the lithographic plate of this invention prior to exposure.

Referring to FIG. 1, there is shown a lithographic plate 1 having a base 3 bearing a silicate-treated surface 5 over which is a surface layer 7 containing, inter alia, a stable, water insoluble light-sensitive diazo resin and a polyamide resin as herein defined, and a dye which renders the image pattern visible upon development.

Figure 2:
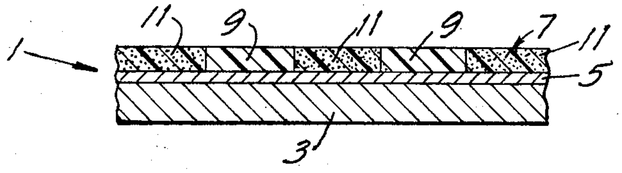
FIG. 2 is the plate of FIG. 1 after exposure.

In FIG. 2, the areas 9 of the surface layer 7 have been light exposed through a transparency or stencil causing the diazo resin in areas 9 to react to become insolubilized. As a consequence, areas 9 also become firmly adhered to the silicate layer 5 of the plate 1. In the remaining, unexposed areas 11 of surface layer 7, the diazo resin remains unreacted and areas 11 are removeable by an aqueous developing medium as herein defined.

Figure 3:
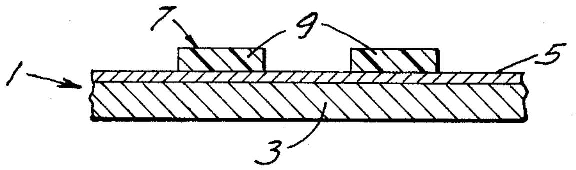
FIG. 3 is the plate of FIG. 1 after development.

Referring to FIG. 3, the plate 1 has been developed to remove the non-exposed areas 11 down to the silicate layer 5. Silicate layer 5 is hydrophilic and oleophobic. Areas 9 of layer 7 survived development. Due to the oleophilicity and hydrophobicity of areas 9, they will accept oleo-ink according to conventional lithographic principles. The plate 1 as shown in FIG. 3 is now ready for the lithographic press.

The following are non-limiting examples illustrative of the invention. The concentration of all coating solutions or compositions are based on weight of material in grams dissolved per 100 gm. of total weight of solution.

EXAMPLE 1

A 2 percent solids coating solution is prepared having the following proportions of ingredients:

| | |
|---|---|
| Diazo condensation product of paraformaldehyde and p-diazodiphenylamine-trisopropyl naphthalene sulfonate | 1.26 g (63% of solids) |
| Polyamide DuPont Elvamide 8063 | 0.50 g (25% of solids) |
| Cellulose acetate butyrate (CAB) (Eastman 272-20) | 0.10 g ( 5% of solids) |
| Orasol Navy Blue 2RB | 0.14 g ( 7% of solids) |
| n-propyl alcohol | 49 grams |
| 2-methoxy ethanol | 49 grams |
| Total Coating Solution | 100.00 grams |

For convenience and for assurance that the solid ingredients are in solution, each solid is prepared, stored, and used as a stock solution:

| | Solvent | % Solids | grams solids per 100 grams stock |
|---|---|---|---|
| Diazo | 2-methoxyethanol | 5% | 5 |
| Polyamide | n-propylalcohol | 5% | 5 |
| CAB | 2-methoxyethanol | 10% | 10 |
| Orasol Navy Blue | 2-methoxyethanol | 10% | 10 |

During preparation of coating solution all ingredients are maintained at 50° C. and additions are made with gentle stirring to prevent precipitation. 1.0 gram of CAB stock solution and 1.4 grams of Orasol Navy Blue stock are added to 25.2 grams of diazo stock. 22.90 grams of 2-methoxyethanol, 39.5 grams of n-proponal, and, finally, 10.0 grams of polyamide stock are added to complete the coating solution. The coating solution is filtered through a one micron filter and transferred to a coating tank with adequate ventilation present.

A continuously formed presensitized plate construction is then coated under subdued light of yellow wavelength with the coating solution previously prepared. The presensitized plate construction is manufactured continuously in accordance with the specific example of Jewett and Case U.S. Pat. No. 2,714,066. Briefly, such lithographic plate structure is prepared by cleaning a smooth-surfaced aluminum sheet, 3½ – 12 mils thick, with trisodium phosphate followed by treatment with nitric acid solution and rinsing in water. The sheet is then treated with an aqueous soluble silicate solution (sodium silicate) and washed clean of any remaining water-soluble materials. The continuous web of aluminum is then flow coated by passing it around a roller partially immersed in the above-described coating solution at a web speed of about 6–7 feet per minute. The temperature of the coating solution in the tank is maintained at about 20° C. A dry coating weight of about 30 mg/ft$^2$ is applied, the exact coating weight applied being determined by the speed of the web, the temperature of the room, and viscosity of the coating solution.

The coated web, coated side upper most, is then air dried, the web being passed alongside a vented hood. At normal room temperature the overcoating dries within a very few minutes. Under subdued light the web so prepared is then die-cut to standard plate sizes and packaged in light-proof containers in which they are forwarded to customers. The entire operation is conducted under subdued light.

The customer using the plate removes the same from its package under subdued light and then exposes the plate to actinic light through a photographic negative or stencil. Conditions of handling of the plate should be the same as for any other metal plate. Substantial improvement over existing printing plates in resistance to heat, e.g., 140° F. for several days, humidity, and halation is characteristic of this construction. The plate may be wiped clean of moisture. After exposure the plate is virtually unaffected by heat, e.g., 140° F. for several days, humidity or fingerprints. The manner of exposure is the same as that described in the Jewett and Case U.S. Pat. No. 2,714,066. For example, exposure of the plate to a 140 ampere carbon arc at a distance of about 54 inches for atime of from 1½ to 3 minutes provides suitable exposure for the light-sensitive diazo resin.

Following exposure an aqueous processing solution of the following composition is poured liberally onto the plate surface:

| Developing Solution | (weight percent) |
|---|---|
| $H_2O$ | 89 |
| Duponol ME | 8 |
| Formaldehyde (37%) | 0.8 |
| Tartaric Acid | 0.425 |
| Magnesium Nitrate | 1.775 |

Foaming of the developer may be controlled by addition of 0.5 percent by weight of a silicone defoamer available under the tradename SAG 470 Anti-Foam. After a few seconds, removal of all non-image area is possible by simply squeegeeing or rinsing the mixture with water from the surface of the plate.

Following development, the plate is then ready to be mounted on the press. If a delay before running is indicated, the entire surface of the plate should then be treated by wiping it thoroughly with an aqueous gumming solution; for example, a slightly acidified water solution of gum arabic which protects the underlying silicate treated aluminum surface in non-image areas. Prior to use, the plate is wiped down with water which removes the gum arabic. Without any further treatment the plate is then mounted on a conventional offset lithographic press for printing.

Prior to exposure, the surface of the plate is yellow-green in color due to the presence of the light-sensitive diazo resin and dye. After exposure, the light-struck areas are now blue in color due to the presence of the dye; the diazo resin yellow color contribution having been eliminated. The unexposed regions remain yellow-green in color and are readily differentiated from the blue, light-struck areas.

When optimum adjustments have been made on the press to produce quality printing with the least blanket pressure against the plate surface, the foregoing plate produces over 15,000 line copies and over 5,000 accurate reproductions of fine halftones and screens from a single plate. Ink transfer by the plate is uncommonly even and ink-water balance is extremely easy to maintain throughout the entire run. Optimum fountain pH is 3.5–4.5, producing a clean-running plate throughout the run even with prolonged shutdown. For periods exceeding one hour, wiping on of a slightly acidified water solution of gum arabic will facilitate quick easy rollups.

In the preceding example the coating weight has about 30 mg./ft². Satisfactory coating weights have been prepared from a low of about 20 mg./ft² to over 2,000 mg./ft². Press life on a properly adjusted conventional press is in the general area of 150 impressions per milligram of coating weight. The quality of the image structure appears to be unaffected by the thickness of the coating. Thus this construction herein described is applicable to all lengths of press run and is limited only by a rapidly increasing exposure time necessary to obtain a satisfactory conversion of the unusually high amounts of diazo sensitizer. Thus, with longer-running plates of 100 mg./ft² or more, exposure may be in excess of 5 minutes.

EXAMPLE 2

As in Example 1 above, stock solutions are prepared of 5 percent of the condensation product of paraformaldehyde and p-diazodiphenylamine 5-nitro ortho-toluene sulfonate in 2-methoxyethanol, 5 percent Elvamide 8061 in dimethyl formamide and 10 percent Neozapon Blue HFL in 2-methoxyethanol. Portions of stock solutions and solvents are mixed, at 50° C. with stirring, in the amounts indicated to provide a coating solution as indicated:

| | Amount of Stock Solution Used | Amount Solids In Coating Composition | Percent Solids in Coating |
|---|---|---|---|
| Diazo | 20 grams | 1.00 grams | 50 |
| Polyamide | 18 grams | 0.90 grams | 45 |
| Neozapon Blue | 1 gram | 0.10 grams | 5 |

| Additional Solvent Added | Total Solvent in Coating Composition |
|---|---|
| 2-methoxyethanol 29.10 grams | 49 grams |
| dimethyl formamide 31.90 grams | 49 grams |
| Total Coating Composition | 100 grams |

Employing the coating composition of this example, a satisfactory lithographic printing plate is prepared according to the procedure of Example 1.

EXAMPLE 3

As in Example 1 above, stock solutions are prepared of 10 percent of the condensation product of paraformaldehyde and p-diazodiphenylamine 2-chloro-5-nitrobenzene sulfonate in dichloromethane, and 2 percent Elvamide 8062 in methanol. A coating solution is prepared from stock solutions and additional solvent by mixing and stirring at 50° C. as indicated:

| | Amount of Stock Solution Used | Amount of Solids in Coating Composition | Percent Solids in Coating |
|---|---|---|---|
| Diazo | 18 grams | 1.80 grams | 90 |
| Polyamide | 10 grams | 0.20 grams | 10 |

| Additional Solvent Added | Total Solvent in Coating Composition |
|---|---|
| Dichloromethane 47.8 grams | 64 grams |
| Methanol 24.20 grams | 34 grams |
| Total Coating Composition | 100 grams |

Employing the coating composition of this example, a satisfactory lithographic printing plate is prepared according to the procedure of Example 1.

EXAMPLES 4–9

Plates prepared in Example 1 are subjected to developing in aqueous solutions of Duponol ME of varying concentrations by weight with results as indicated in table:

| Example | Concentration of Duponol ME in Water | Development Time |
|---|---|---|
| 4 | 0.008% | 5 minutes |
| 5 | 0.08% | 1 minute |
| 6 | 0.8% | 6 seconds |
| 7 | 4.0% | 3½ seconds |
| 8 | 8.0% | 3 seconds |
| 9 | 30.0% | 3 seconds |

In all cases satisfactory development was obtained, while loss of image area was essentially nil. At lower concentrations, less than 0.1 percent, a slight rubbing action is needed. However, this does not result in any substantial loss of the exposed polyamide-diazo coating. Above about 30 percent by weight, there is substantial gel formation in the developer as well as foaming which makes such concentrations undesirable.

EXAMPLES 10–16

To establish the effect of variations in concentration of diazo and polyamide resins the following formulations are prepared employing the diazo and polyamide resins of Example 1:

| | 10 | 11 | 12 | 13 | 14 | 15 | 16 |
|---|---|---|---|---|---|---|---|
| % diazo based upon diazo-polyamide combination | 10 | 25 | 37 | 50 | 63 | 80 | 90 |
| diazo, grams | 1.0 | 2.5 | 3.7 | 5.0 | 6.3 | 8.0 | 9.0 |
| polyamide, grams | 9.0 | 7.5 | 6.3 | 5.0 | 3.7 | 2.0 | 1.0 |

Each formulation contains the following ingredients in grams:

| | |
|---|---|
| methylviolet | 0.4 |
| tetrahydrofurfuryl alcohol | 0.7 |
| formaldehyde (sol.) 37% | 0.7 |
| methanol | 291.8 |
| methylcellosolve | 97.3 |
| | 400.9 |

Each formulation is coated on smooth silicated aluminum at about 100–140 mg./ft². The samples of Examples 10–16 are compared by press test on a conventional lithographic press to first apparent breakdown and ease of development, fresh and after accelerated aging. No lacquer or image strengthener is applied to any of the plates after development.

| | 10 | 11 | 12 | 13 | 14 | 15 | 16 |
|---|---|---|---|---|---|---|---|
| Press test | 0 | 2,000 | 3,000 | 6,000 | 15,000 | 6,000 | 11,000. |
| Development: | | | | | | | |
| Fresh | Could not develop. | Difficult, slow. | Slow | Good | Easy | Very easy | Very easy. |
| 2 hrs. 130° F. dry bulb temp.; 120° F. wet bulb temp. | do | Very difficult. | Difficult | do | do | do | Do. |
| 72 hrs. 130° F. dry bulb temp.; 120° F. bulb temp | do | Could not develop. | Could not develop. | Very difficult. | do | do | Do. |

What is claimed is:

1. An organophilic composition comprising a mixture of a mutually soluble polyamide resin and a light-sensitive diazo resin present in proportions sufficient to provide a dried coating comprising at least 50 percent by weight of said diazo resin and no more than about 50 percent by weight of said polyamide resin.

2. The composition of claim 1 wherein said diazo resin and said polyamide resin are both alcohol soluble.

3. The composition of claim 1 wherein said diazo resin and said polyamide resin are present in proportions sufficient to provide a dried coating comprising about 60 percent to about 70 percent by weight diazo resin and about 30 percent to about 40 percent by weight polyamide resin.

4. The composition of claim 1 wherein said polyamide resin is a copolymer of caprolactam and the hexamethylene diamine salts of adipic and sebacic acid.

5. The composition of claim 1 wherein said polyamide resin is a copolymer of caprolactam and the hexamethylene diamine salts of adipic and sebacic acid and said diazo resin is a salt of the condensation product of paraformaldehyde and p-diazodiphenyl amine.

6. An article comprising a dimensionally stable substrate bearing a coating on at least one surface thereof comprising at least 50 percent by weight of a light-sensitive diazo resin and no more than about 50 percent by weight of a mutually soluble polyamide resin.

7. The article of claim 6 wherein said substrate is a metal.

8. The article of claim 6 wherein said substrate is paper.

9. The article of claim 6 wherein said polyamide and said diazo resin are soluble in alcohol.

10. The article of claim 6 wherein said diazo resin is present to the extent of about 60 percent to about 70 percent of said coating and said polyamide resin is present to the extent of about 30 percent to about 40 percent by weight of said polyamide resin.

11. The article of claim 6 wherein said polyamide resin is a copolymer of caprolactam, and the hexamethylene diamine salts of adipic and sebacic acid and said diazo resin is a salt of the condensation product of paraformaldehyde and p-diazodiphenyl amine.

12. The article of claim 6 wherein said surface of said substrate bearing said coating is a passivatably treated surface.

13. The article of claim 6 wherein said surface of said substrate is treated with a soluble silicate to passivate said surface with respect to said coating.

14. The article of claim 6 wherein said substrate is aluminum and said surface bears a treatment of a soluble silicate to passivate said surface with respect to said coating.

* * * * *